(12) United States Patent
Tschanz et al.

(10) Patent No.: US 8,848,858 B2
(45) Date of Patent: Sep. 30, 2014

(54) INTEGRATED NON-VOLATILE MONOTONIC COUNTERS

(75) Inventors: James W. Tschanz, Portland, OR (US);
Christopher B. Wilkerson, Portland, OR (US); Scott Robinson, Portland, OR (US); Shih-Lien Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 13/564,497

(22) Filed: Aug. 1, 2012

(65) Prior Publication Data

US 2014/0037042 A1    Feb. 6, 2014

(51) Int. Cl.
*G06M 3/00* (2006.01)
(52) U.S. Cl.
USPC ............................................. 377/26; 377/19
(58) Field of Classification Search
None
See application file for complete search history.

(56) References Cited

U.S. PATENT DOCUMENTS

| | | |
|---|---|---|
| 7,348,857 B1* | 3/2008 | Ecker et al. ............... 331/44 |
| 7,714,670 B1 | 5/2010 | Ecker et al. |
| 2011/0035535 A1* | 2/2011 | Locasio et al. ............ 711/103 |
| 2011/0249525 A1 | 10/2011 | Haass et al. |
| 2012/0002764 A1 | 1/2012 | Hsiao et al. |
| 2012/0076251 A1 | 3/2012 | Chen et al. |
| 2012/0126847 A1 | 5/2012 | Kosonocky et al. |
| 2012/0161885 A1* | 6/2012 | Saneyoshi et al. ........... 331/55 |

OTHER PUBLICATIONS

"International Application Serial No. PCT/US2013/047868, International Search Report mailed Oct. 22, 2013", 3 pgs.
"International Application Serial No. PCT/US2013/047868, Written Opinion mailed Oct. 22, 2013", 8 pgs.

* cited by examiner

*Primary Examiner* — Cassandra Cox
(74) *Attorney, Agent, or Firm* — Schwegman Lundberg & Woessner, P.A.

(57) ABSTRACT

Some embodiments include a counter having a first generator to generate signals having different frequencies, and a second generator to generate counter values of the counter. Each of the counter values may be based at least in part on a number of transitions of a respective signal among the signals. Other embodiments are described.

20 Claims, 11 Drawing Sheets

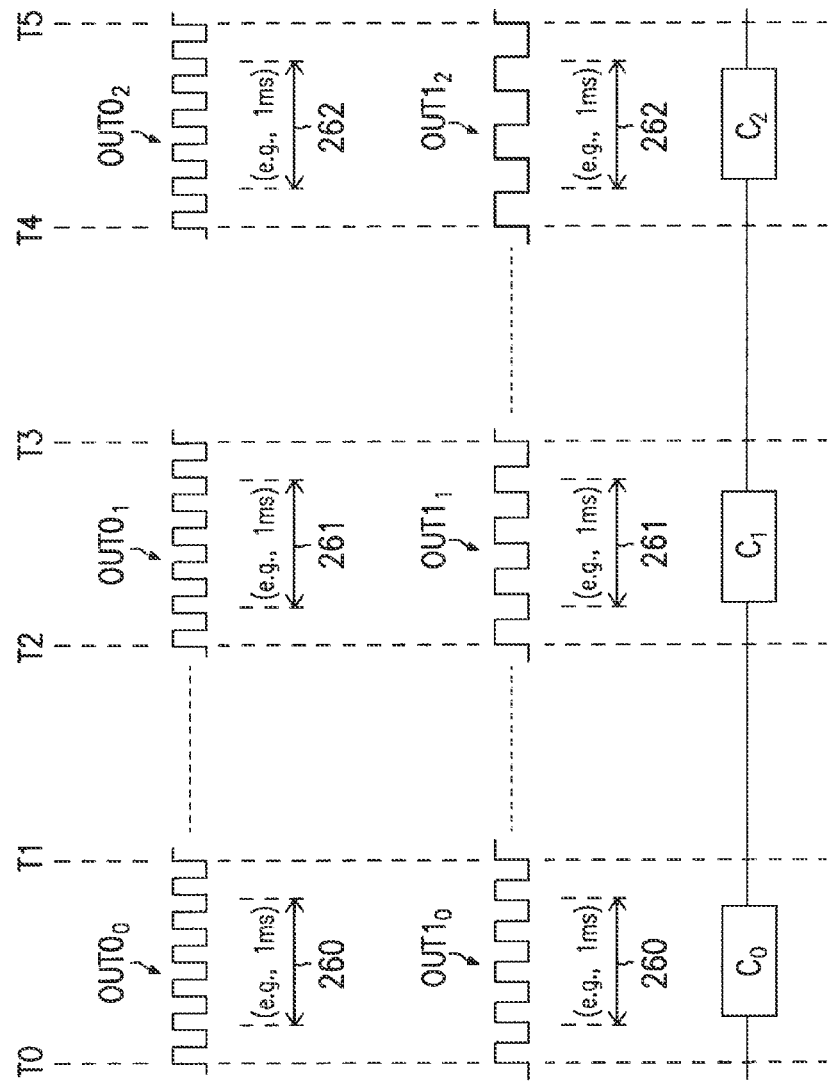

| RANGE FOR EACH COUNTER VALUE BASED ON INITIAL VALUE (RANGE LENGTH L) | | GENERATED COUNT | COUNTER VALUE | EQUIVALENT DECIMAL VALUE |
|---|---|---|---|---|
| LOWER LIMIT | UPPER LIMIT | | | |
| INITIAL VALUE I | | $C_0$ | $X_0$ | 0 |
| $X_0+1$ to | $(X_0+1+L)$ | $C_1$ | $X_1$ | 1 |
| $(X_0+2+L)$ to | $(X_0+2+2L)$ | $C_2$ | $X_2$ | 2 |
| $(X_0+3+2L)$ to | $(X_0+3+3L)$ | $C_3$ | $X_3$ | 3 |
| $(X_0+4+3L)$ to | $(X_0+4+4L)$ | $C_4$ | $X_4$ | 4 |
| $(X_0+5+4L)$ to | $(X_0+5+5L)$ | $C_5$ | $X_5$ | 5 |

FIG. 2C

| RANGE FOR EACH COUNTER VALUE BASED ON INITIAL VALUE (RANGE LENGTH L=80) | | GENERATED COUNT | COUNTER VALUE | EQUIVALENT DECIMAL VALUE |
|---|---|---|---|---|
| INITIAL VALUE I=−3 | | | | |
| LOWER LIMIT | UPPER LIMIT | | | |
| −2 to | 78 | $C_0$ | $X_0$ | 0 |
| 79 to | 159 | $C_1$ | $X_1$ | 1 |
| 160 to | 240 | $C_2$ | $X_2$ | 2 |
| 241 to | 321 | $C_3$ | $X_3$ | 3 |
| 322 to | 410 | $C_4$ | $X_4$ | 4 |
| | | $C_5$ | $X_5$ | 5 |

FIG. 2D

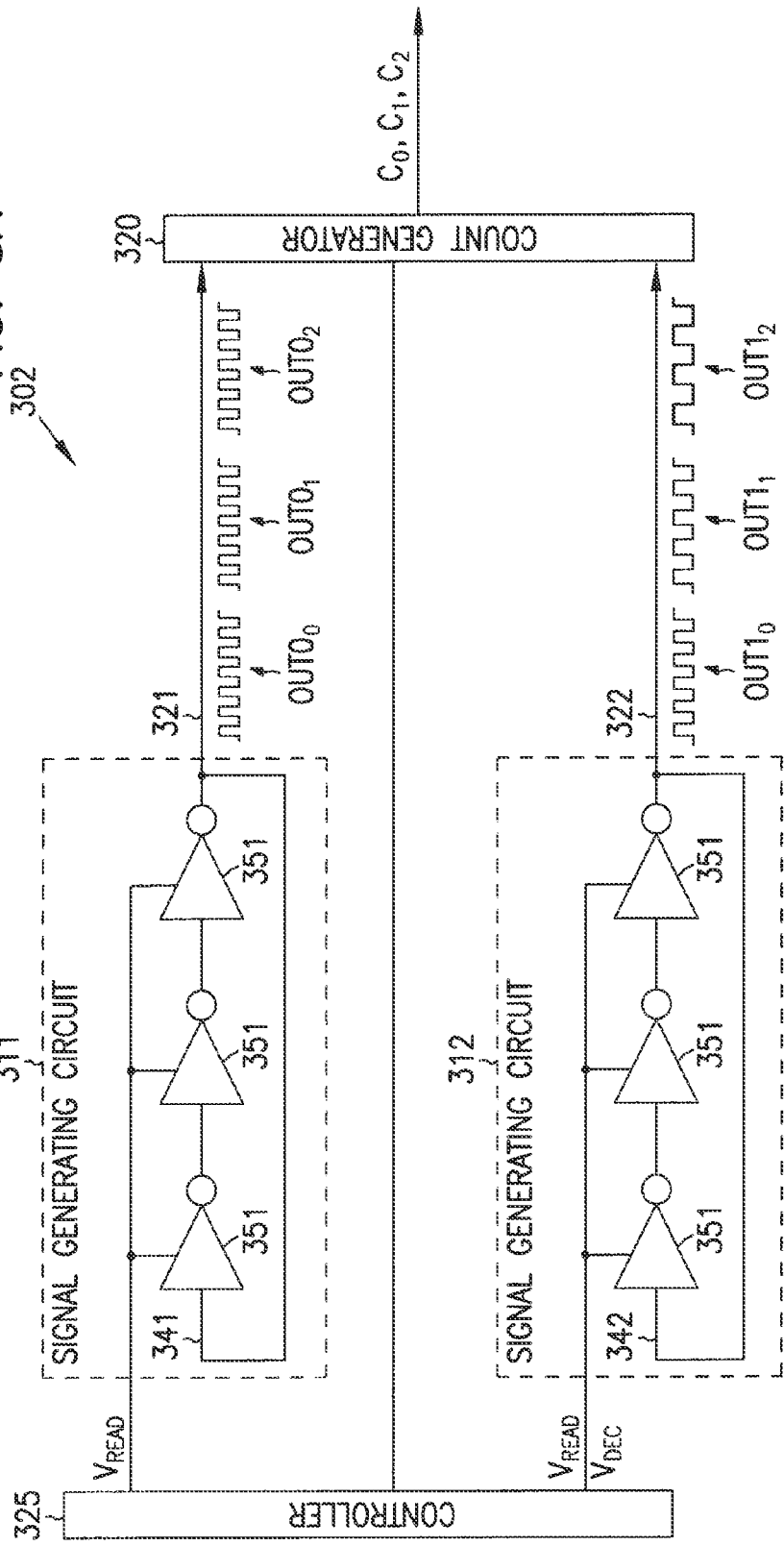

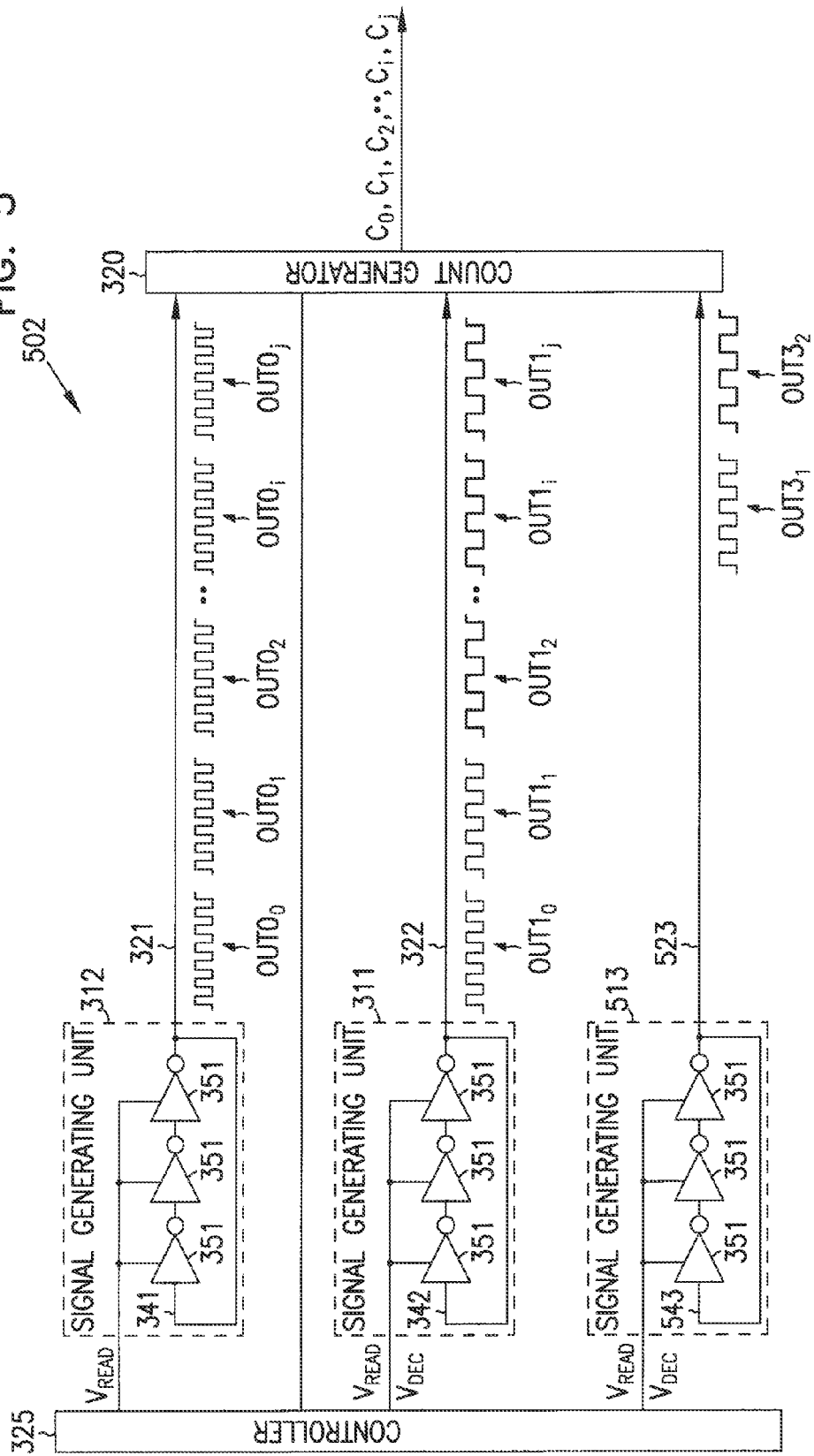

INTEGRATED NON-VOLATILE MONOTONIC COUNTERS

FIELD

Embodiments described herein relate to security in electronic systems. Some embodiments relate to counters in such systems.

BACKGROUND

Many electronic systems, such as computers and cellular phones, often include a counter to generate counter values. The system may use the counter values for various purposes. For example, the counter values may be used as identification numbers, version numbers, or other kinds of reference values associated with certain information in the system.

Some conventional counters may employ a relatively large number of programmable fuses to store a corresponding large number of counter values. Such a large number of programmable fuses may reduce space in these systems. Further, in some systems, the counter values may play some key roles in the system security. Thus, if the counter values in the system are improperly protected, system security may be compromised,

BRIEF DESCRIPTION OF DRAWINGS

FIG. 2B shows a timing diagram for some signals in the counter of FIG. 2A, according to some embodiments described herein.

FIG. 2C is a chart showing ranges associated with counter values and equivalent decimal number values for the counts of the counter of FIG. 2A, according to some embodiments described herein.

FIG. 2D is a chart showing example values for the chart of FIG. 2C, according to some embodiments described herein.

FIG. 3A shows a schematic diagram of a counter including a signal generating circuit having ring oscillators, according to some embodiments described herein.

FIG. 5 shows block diagram of a counter having multiple ring oscillators, according to some embodiments described herein.

DETAILED DESCRIPTION

Figure 1:
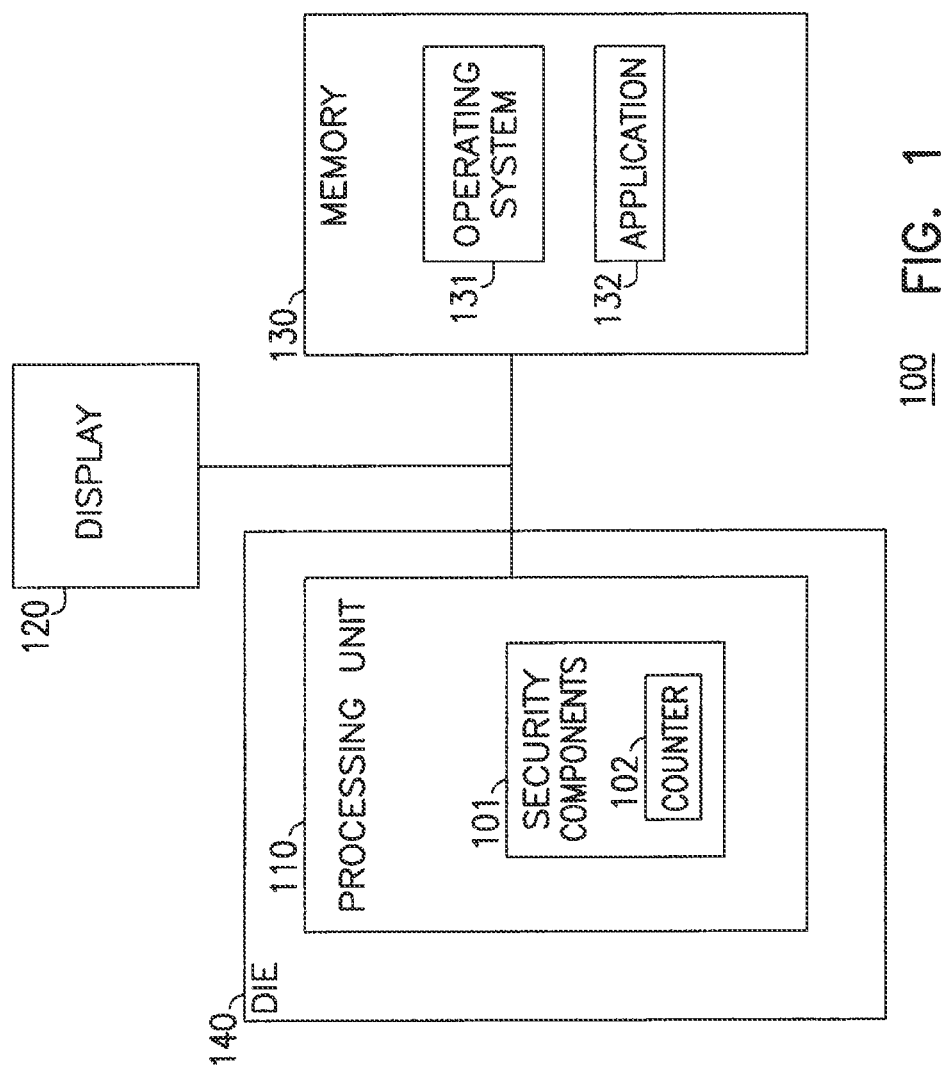
FIG. 1 shows a block diagram of a system, according to some embodiments described herein.

FIG. 1 shows a block diagram of system 100, according to some embodiments described herein. System 100 may include an electronic system, such as a computer (e.g., desktop, laptop, or tablet computer), a cellular phone (e.g., a smart phone), or other electronic systems, As shown in FIG. 1, system 100 may include a processing unit 110, a memory 130, and a display 120. For simplicity, FIG. 1 omits other elements of system 100 to avoid obscuring the embodiments described herein. For example, system 100 may include one or more of a keyboard, antennas, a non-volatile memory port (e.g., a Universal Serial Bus (USB) port), a graphics processor, speakers, and other elements.

Display 120 may include an LCD screen, which may include a touch screen. Memory 130 may include volatile memory, non-volatile memory, or a combination of both. Memory 130 may operate to store an operating system (OS) 131 and an application 132 (e.g., software program). Each of operating system 131 and application 132 may include instructions (e.g., software programming instructions) that may be executed by processing unit 110.

Processing unit 110 may be configured to process information in system 100. Processing unit 110 may include a single processor or multiple processors. The processor or processors may include one or more general purpose processors, one or more application-specific integrated circuits (ASICs), or other types of processors. Processing unit 110 may include security components 101. For simplicity, FIG. 1 omits other elements of processing unit 110. For example, processing unit 110 may include an arithmetic logic unit (ALU), registers, cache memory, and other elements.

Security components 101 may be configured to provide security for certain operations in system 100. For example, security components 101 may be used to prevent or reduce the chance of attacks to system 100 such as replay attacks and other malicious attacks. The counter values generated by security components 101 in FIG. 1 may also be used to prevent or reduce an unauthorized extension of an expiration time of certain items (e.g., software programs and software licensing contracts) in a system 100. Other uses of the counter values provided by security components 101 will become apparent to those skilled in the art upon reading and understanding the embodiments described herein.

Security components 101 may include (e.g., be implemented by) firmware, hardware, software, or any combination of firmware, hardware, and software. For example, security components 101 may include hardware (e.g., circuitry) that may form at least part of a counter 102. Counter 102 may be configured to generate counts having different counter values. The counter values may be used in security components 101 for security purposes (e.g., for use in a security application) mentioned above or for other purposes.

Counter 102 may include a non-volatile counter, such that counter 102 may retain its current counter value (e.g., current state) across power cycles. For example, if value "X" is the current counter value of counter 102 when power in system 100 is turned off (e.g., disconnected from system 100), then counter 102 is able to generate (e.g., regenerate) the value "X" as its counter value when system 100 is turned on (e.g. connected to system 100). Counter 102 may also include a monotonic counter, such that counter values generated by counter 102 follow an order that is monotonic. For example, counter values of counter 102 may only be incremented as a function of time, and its current counter value (e.g., current state) cannot be decreased (e.g., rolled back). Thus, counter 102 may include a non-volatile monotonic counter.

System 100 may also include a die 140. Die 140 may include a semiconductor die (e.g., silicon-based die). As shown in FIG. 1, processing unit 110 and counter 102 may be located in (e.g., formed in or formed on) the same die 140. In an alternative arrangement, at least a portion of security components 101 may be located outside processing unit 110 in other areas of system 100. For example, in such an alternative arrangement, counter 102 may be located outside die 140 in another part of system 100.

Including a counter, such as counter 102, in the same die 140 with processing unit 110 may enhance security (e.g., at least on the platform level) of system 100. For example, since counter 102 is located in the same die 140 with processing unit 110, counter values generated by counter 102 may be further protected. This may enhance security in system 100, such as by reducing vulnerability to spoof attacks. Further, including counter 102 in the same die 140 with processing unit 110, as shown in FIG. 1, may allow system 100 (e.g., most parts of system 100) to be included in a system on a chip (SOC). Moreover, since counter 102 may retain its current counter value and its current value cannot be decreased, counter 102 may prevent or reduce the chance of system 100 suffering from power cycle attacks (in which system 100 may be deprived of power unit counter 102 resets).

Counter 102 may include the counters described below with reference to FIG. 2A through FIG. 6.

Figure 2A:
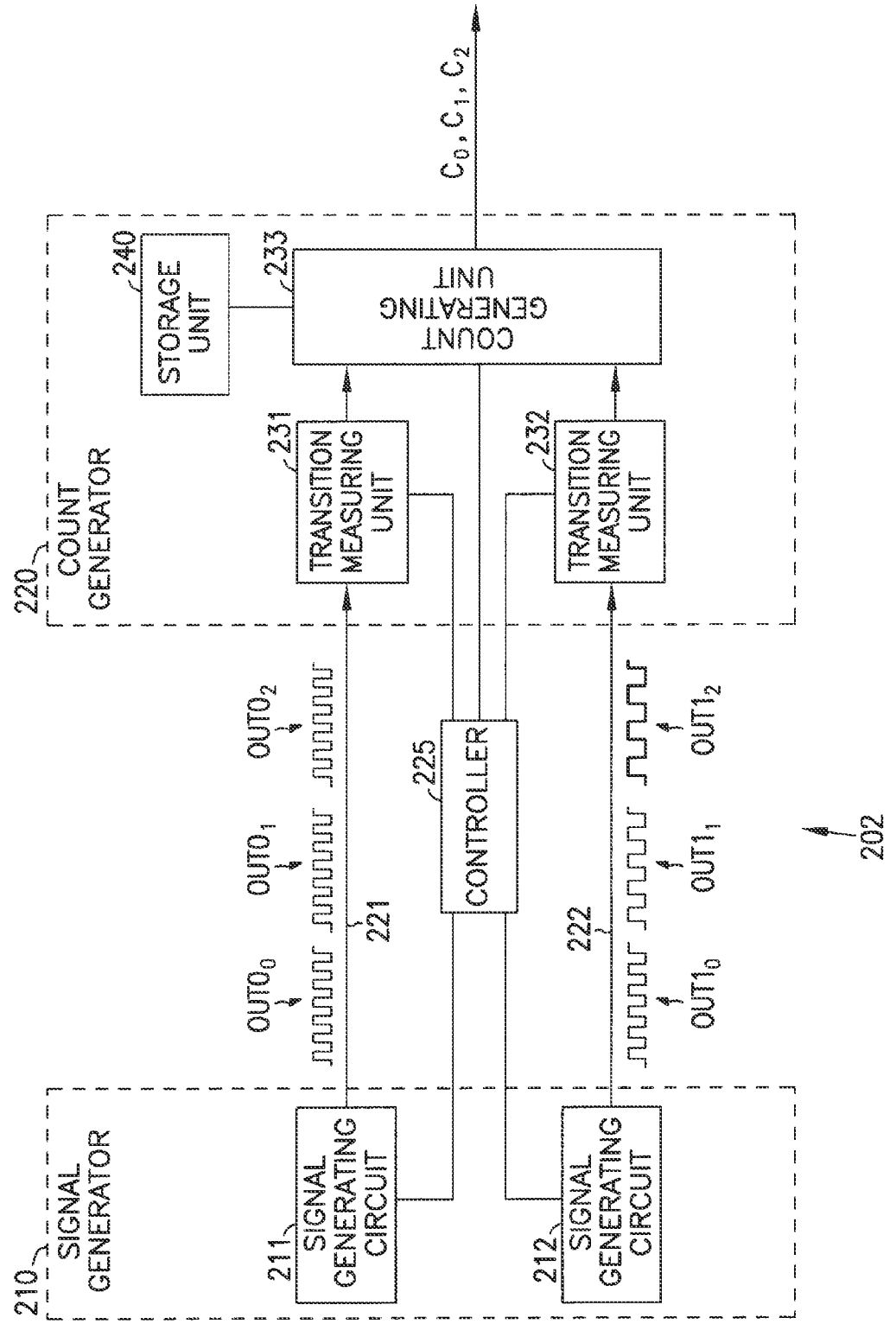
FIG. 2A shows a block diagram of a counter having signal generating circuits, according to some embodiments described herein.

FIG. 2A shows a block diagram of a counter 202, according to some embodiments described herein. Counter 202 may include or be included in counter 102 of FIG. 1. As shown in FIG. 2A, counter 202 may include a signal generator 210, a count generator 220, and a controller 225.

Signal generator 210 may include signal generating circuits 211 and 212. Signal generating circuit 211 may be configured to generate signals $OUT0_0$, $OUT0_1$, and $OUT0_2$ and provide them at its output node 221. Signal generating circuit 212 may be configured to generate signals $OUT1_0$, $OUT1_1$, and $OUT1_2$ and provide them at its output node 222. Each of the signals at output nodes 221 and 222 may include a periodic signal. FIG. 2A shows only three signals at each of output nodes 221 and 222 for simplicity. However, the number of signals may vary.

Count generator 220 may include transition measuring units 231 and 232, a count generating unit 233, and a storage unit 240. Transition measuring unit 231 may be configured to measure (e.g., count) a number of transitions of the signals at output node 221, such as signals $OUT0_0$, $OUT0_1$, and $OUT0_2$. Transition measuring unit 232 may be configured to measure the number of transitions of the signals at output node 222, such as signals $OUT1_0$, $OUT1_1$, and $OUT1_2$.

Count generating unit 233 may be configured to generate counts $C_0$, $C_1$, and $C_2$ having different counter values based the number of transitions of signals on output nodes 221 and 222. Count $C_0$ may be generated before count $C_1$, count $C_1$ may be generated before count $C_2$. The time period between a generation of one count (e.g., $C_0$) and a generation of another count (e.g., $C_1$) may be in time unit, such as second, minute, day, or other time units. FIG. 2A shows only three counts $C_0$, $C_1$, and $C_2$ for simplicity. The total number of counts generated by counter 202 may vary. For example, counter 202 may generate tens, hundreds, thousands, or more of counts (e.g., $C_0$, and $C_N$, where N corresponds to the total number of counts). The order of counter values of counter 202 may be monotonic. In other words, counter 202 may generate a count in a uni-direction. For example, the counter values associated with count $C_0$, $C_1$, and $C_2$ generated by counter 202 may follow an increasing order equivalent to an increasing values of decimal numbers (e.g., 0, 1, 2, and so on).

Storage unit 240 may include a memory e.g., a non-volatile memory) to store an initial value. In order to achieve consistency in counter values across a variety of operating voltages and temperatures, counter 202 may use the stored initial value as a reference value to generate each of counter values of counter 202. The initial value may be generated based on numbers of transitions of signals (e.g., $OUT0_0$ and $OUT1_0$) initially generated at output nodes 221 and 222. Based on the initial value and the numbers of transitions of signals (e.g., $OUT0_1$ and $OUT1_1$) generated (e.g., subsequently generated) at output nodes 221 and 222, counter 202 may also determine how many times its counter values have been changed.

A number of transitions of a signal refers to a quantity of transitions (i.e., how many transitions) that signal has during a given amount of time. Such a given amount of time may be duration of time measured in any time unit, such as millisecond (ms) or other time units. For example, signal $OUT1_0$ may have 10000 transitions within 1 ms.

A transition of a signal may refer to an event where the signal changes from one level to another level, such as from a lower level to a higher level (e.g., rising edge) or from a higher level to a lower level (falling edge). Thus, a transition of a signal may include a rising edge or a falling edge of a signal. The number of transitions of a signal may include a number of only the rising edges, the number of only the falling edges, or the number of a combination of the rising and falling edges of the signal measured within a given amount of time (e,g., 1 ms). A transition of a signal may also refer to a transition from one period (i.e., cycle time) to another period of the signal. Thus, a number of transitions of a signal may refer to a specific quantity of periods (i.e., cycles) of the signal within a given amount of time (e.g., 1 ms).

Counter 202 may retain its current counter value (e.g., current state) across power cycles. For example, if counter 202 has a current count of $C_2$ when power supplied to counter 202 (or supplied to a device or system containing counter 202) is turned off, then counter 202 is able o regenerate count $C_2$ as its current counter value when the power is turned on (e.g., turned on after a device or system containing counter 202 has been powered off). Counter values of counter 202 may only be incremented as a function of time. A current counter value (e.g., current state) of counter 202 may not be changed (e.g., decreased). For example, if a current count of counter 202 is $C_2$, then counter 202 may not be able to regenerate counts $C_1$ or count $C_0$ if counts $C_0$ and $C_1$ are generated before count $C_2$ is.

Counter 202 may include a controller 225 to control operations in counter 202. For example, controller 225 may provide a control (e.g., a control in the form of one or more signals) at a certain time to signal generator 210 to cause signal generator 210 generate signals at output nodes 221 and 222. In another example, controller 225 may provide a control (e.g., a control in the form of one or more signals) at a certain time to count generator 220 to cause count generator 220 to generate anew count value. Although counter 202 is shown as having several separate functional elements (e.g., count generator 220 and controller 225), one or more of these functional elements may be combined and may be implemented by any combination of firmware, hardware, and software-configured elements.

FIG. 2B shows a timing diagram for signals $OUT0_0$, $OUT0_1$, $OUT0_2$, $OUT1_0$, $OUT1_1$, and $OUT1_2$ of FIG. 2A. In FIG. 2B, T0 through T5 represent different times. Time T0 may occur before time T1. Time T1 may occur before time T2, and so on. FIG. 2B also shows amount of times 260, 261, and 262. Each of amount of times 260, 261, and 262 corresponds to a specific (e.g., predetermined) value. Amount of times 260, 261, and 262 may have an equal value (e.g., equal units of time). FIG. 2B shows an example of amount of times 260, 261, and 262 having an equal value of 1 ms. However, another amount of time may be used.

As shown in FIG. 2B, signals $OUT0_0$, $OUT0_1$, and $OUT0_2$ may have the same frequency. Thus, signals $OUT0_0$, $OUT0_1$, and $OUT0_2$ may have an equal number of transitions in the same given amount of time (e.g., 1 ms). Signals $OUT1_0$, $OUT1_1$, and $OUT1_2$ may have different frequencies. For example, signal $OUT1_0$ may have a frequency greater than a frequency of signal $OUT1_1$. Signal $OUT1_1$ may have a frequency greater than a frequency of signal $OUT1_2$. Thus, signals $OUT0_0$, $OUT1_1$, and $OUT1_2$ may have different numbers of transitions in the same given amount of time (e,g., 1 ms).

FIG. 2B shows an example where amount of time 260 is less than the total amount of time (i.e., less than the entire time length) from time T0 to time T1. Amount of time 260, however, may be equal to the total amount of time from time T0 to time T1. Similarly, amount of time 261 may be equal to the total amount of time from time T2 to time T3. Amount of time 262 may be equal to the total amount of time from time T4 to time T5.

Signals $OUT0_0$ and $OUT1_0$ may be generated between times T0 and T1. Each of signals $OUT0_0$ and $OUT1_0$ may have a plurality of transitions from time T0 and to time T1. Count generator 220 FIG. 2A) may be configured to measure (e.g., count) at least a portion of the plurality of transitions of signal $OUT0_0$ and at least a portion of the plurality of transitions of signal $OUT1_0$ in amount of time 260. Count $C_0$ and its associated counter value may be generated based on a difference in values between the measured numbers of transitions of signals $OUT0_0$ and $OUT1_0$.

Signals $OUT0_1$ and $OUT1_1$ may be generated between times T2 and T3. Each of signals $OUT0_1$ and $OUT1_1$ may have a plurality of transitions from time T2 and to time T3. Count generator 220 (FIG. 2A) may be configured to measure (e.g., count) at least a portion of the plurality of transitions of signal $OUT0_1$ and at least a portion of the plurality of transitions of signal $OUT1_1$ in amount of time 261. Count $C_1$ and its associated counter value may be generated based on a difference in values between the measured numbers of transitions of signals $OUT0_1$ and $OUT1_1$.

Signals $OUT0_2$ and $OUT1_2$ may be generated between times T4 and T5. Each of signals $OUT0_2$ and $OUT1_2$ may have a plurality of transitions from time T4 and to time T5. Count generator 220 (FIG. 2A) may be configured to measure (e.g., count) at least a portion of the plurality of transitions of signal $OUT0_2$ and at least a portion of the plurality of transitions of signal $OUT1_2$ in amount of time 262. Count $C_2$ and its associated counter value may be generated based on a difference in values between the measured numbers of transitions of signals $OUT0_2$ and our $OUT1_2$.

As shown in FIG. 2B, each of counts $C_0$, $C_1$, and $C_2$ may be a current count during a respective time interval For example, between times T0 and T1, counts $C_0$ may be a current count. Between times T2 and T3, counts $C_1$ may be a current count. Between times T4 and T5, counts $C_2$ may be a current count.

As described above, the number of transitions occurring in a given amount of time for signals $OUT0_0$, $OUT0_1$, and $OUT0_2$ may be the same. The number of transitions occurring in a given amount of time for signals $OUT1_0$, $OUT1_1$, and $OUT1_2$ may be different from each other. Thus, the difference in values between the numbers of transitions of one of signals $OUT0_0$, $OUT0_1$, and $OUT0_1$ and the number of transitions of one of signals $OUT1_0$, $OUT1_1$, and $OUT1_2$ may be different from each other. Therefore, counter values of counter 202 generated based on the differences in values with counts $C_0$, $C_1$, and $C_2$ are different from each other.

FIG. 2C is a chart 271 showing ranges 281 through 285 associated with counter values $X_0$ through X5 and equivalent decimal number values for counts $C_0$ through $C_5$ of counter 202 of FIG. 2A, according to some embodiments described herein. In FIG. 2C, chart 271 shows six counts ($C_0$ through $C_5$) and six corresponding counter values ($X_0$ through X5) as an example. The number of counts and their corresponding counter values may vary e.g., hundreds, thousands, or more counts).

Chart 271 may be populated with values (e.g., during startup of counter 202), such as example values shown in FIG. 2D. Counter 202 (FIG. 2A) may provide counts having counter values based on the values in chart 271. Chart 271 may be formed in the form of a table (e.g., lookup table). Any combination of firmware, hardware, and software may be used to form chart 271.

In chart 271, initial value I may be obtained based on a difference in values between measured numbers of transitions of signals $OUT0_0$ and $OUT1_0$ (FIG. 2A). Initial value I may be used to provide a counter value (e.g., $X_0$) to a count (e.g., $C_0$) that counter 202 may generate for a first time.

Range length L in chart 217 in FIG. 2C indicates a number of range values (how many different range values) that each of ranges 281 through 285 may have. The range values are different from one range to another. There may be no overlapping in range values among ranges 281 through 285. Ranges 281 through 285 may have the same range length L. The range length L may be a predetermined (e.g., known) value.

FIG. 2D is a chart 272 showing example values for chart 271 of FIG. 2C, according to some embodiments described herein. FIG. 2D shows an example of range length=80. Thus, in chart 272, each of ranges 281 through 285 may have 50 different range values. Range length L=80 is used as an example. A different value for range length L may be selected.

Initial value I=−3 in chart 272 is used as an example. Initial value I may vary, depending on the measured number of transitions of an initial signal (e.g., $OUT0_0$) at output node 221 (FIG. 2A) and the measured number of transitions of an initial signal (e.g., $OUT1_0$). In the example of chart 272, initial value I=−3 may be calculated as follows. For example, upon generation of an initial count (e.g., $C_0$), if a measured number of transitions of an initial signal (e.g., $OUT0_0$) at output node 221 (FIG. 2A) is 10,000, and a measured number of transitions of an initial signal (e.g., $OUT1_0$) at output node 222 is 10003, then a difference in values between these two numbers of transitions is 10000−10003=−3. Thus, in this example, initial value I=10000−10003=−3.

A lower limit range value and an upper limit range value of each of ranges 281 through 285 in chart 272 may be calculated based on the initial value (e.g., I=−3) and range length L (e.g., L=80). For example, range 281 has 80 range values from a lower limit range value of −2 to an upper limit range value of 78. In another example, the range 282 has 80 range values from a lower limit range value of 79 to an upper limit range value of 159. Other ranges 283, 284, and 285 have respective range values from 160 to 240, from 241 to 321, and from 322 to 410.

Based on range values in the ranges (e.g., 281 through 285) in chart 272, counter 202 (FIG. 2A) may provide an appropriate counter value (e.g., one of $X_0$ through $X_5$). For example, in an operation to provide a counter value (e.g., current counter value), if a measured number of transitions of the signal (e.g., $OUT0_1$) at output node 221 is 10,000, and a measured number of transitions of an signal (e.g., $OUT1_1$) at output node 222 is 9950, then a difference in values between these two numbers of transitions is 10000−9950=50. Thus, based on chart 272 in FIG. 2D, the counter value associated with value range 50 is $X_1$. Therefore, in this example, counter 202 provides a counter value of $X_1$ (in other words, the current state of counter 202 in this example is $X_1$). Based on chart 272, the counter value ($X_1$) in this example may be equivalent to a decimal number value of one. This may also mean that counter 202 has changed its counter value (e.g., changed its state) one time, such as changing from initial counter value $X_0$ to a counter value $X_1$ or equivalently, changing from 0 to 1 in decimal number values.

In the above example, if the measured number of transitions of the signal (e.g., $OUT0_1$) at output node 221 is 10,000, and a measured number of transitions of an initial signal (e.g., $OUT1_1$) at output node 222 is 9875, then a difference in values between these two numbers of transitions is 10000−9875=125. Thus, based on chart 272 in FIG. 2D, the counter value associated with value range 125 is $X_2$. Therefore, counter 202 would provide a counter value of $X_2$ (in other words, the current state of counter 202 is $X_2$). Based on chart 272, the counter value ($X_2$) may be equivalent to a decimal number value of two. This may also mean that counter 202 has changed its counter value (e.g., changed its state) two times, such as changing (e.g., for a first time) from initial counter value $X_0$ to a counter value $X_1$ and changing (e.g., for a second time) from counter value $X_1$ to a counter value $X_2$.

Controller 225 may cause counter 202 to change (e.g., increase) its counter value one time (e.g., from $X_0$ to $X_1$, from $X_1$ to $X_2$, or from $X_2$ to $X_3$, and so on) after every fixed period of time has elapsed. The fixed period of time may be predetermined by the application or by the user. The period of time may be in any time unit, such as second, minute, day, or other time units. For example, if the time unit is minute, then counter 202 may automatically change its value one time after every minute from a starting minute (e.g., reference minute). In another example, if the time unit is day, then the counter may automatically change its value one time every day from a starting day (e.g., reference date). The period of time may be determined (e.g., selected) by components of a system that includes counter 202, such as by processing unit 110 or application 132 of system 100 of FIG. 1.

Changing the counter value after every fixed period of time has elapsed may improve security in a system that includes counter 202. For example, an application (e.g., 132 in FIG. 1) may request counter 302 to automatically change (e.g., increase) its counter value one time after every fixed period of time (e.g., each day) has elapsed. Then, based on the number of times that the counter has changed its counter values, the application may be able to determine whether the usage of the application has expired.

Thus, as described above with reference to FIG. 1 through FIG. 2D, counter 202 (FIG. 2A) may generate a count in a uni-direction, such as counts $C_0$, $C_1$, and $C_2$ having count values $X_0$, $X_2$, and $X_3$, respectively, in which count values $X_0$, $X_2$ and $X_3$ may follow an increasing order. The count may be used for a security application in a device or system (e.g., system 100 of FIG. 1). Counter 202 (FIG. 2A) may generate a new count value in the uni-direction in response to a control (e.g., a control provided by controller 225 of FIG. 2A). Counter 202 may retain the new count value after the device or system (e.g., system 100) containing counter 202 has been powered off.

FIG. 3A shows a schematic diagram of a counter 302 including signal generating circuits 311 and 312 having ring oscillators, according to some embodiments described herein. Signal generating circuits 311 and 312 may correspond to signal generating circuits 211 and 212, respectively, of FIG. 2A. As shown in FIG. 3A, counter 302 of FIG. 3A may include a count generator 320 and controller 325, which may correspond to count generator 220 and controller 225, respectively, of FIG. 2A.

As shown in FIG. 3A, signal generating circuit 311 may include stages 351 coupled in series between an input node 341 and an output node 321. Each of stages 351 may include an inverter. Input node 341 and output node 321 may be coupled to each other. The arrangement of stages 351 and input and output nodes 341 and 321 may form a ring oscillator. Signal generating circuit 311 may generate signals $OUT0_0$, $OUT0_1$, and $OUT0_2$. Signals $OUT0_0$, $OUT0_1$, and $OUT0_2$ may correspond to signals $OUT0_0$, $OUT0_1$, and $OUT0_2$ of FIG. 2A. Output node 321 in FIG. 3A may correspond to output node 221 of FIG. 2A.

Signal generating circuit 312 in FIG. 3A may include elements similar to or identical to those of signal generating circuit 311. For example, signal generating circuit 312 may include stages 351 coupled in series between an input node 342 and an output node 322. The arrangement of stages 351 and input and output nodes 342 and 322 as shown in FIG. 3A may form a ring oscillator. Signal generating circuit 312 may generate signals $OUT1_0$, $OUT1_1$, and $OUT1_2$. Signals $OUT1_0$, $OUT1_1$, and $OUT1_2$ in may correspond to signals $OUT1_0$, $OUT OUT1_1$, and $OUT1_2$ of FIG. 2A. Output node 322 in FIG. 3A may correspond to output node 222 of FIG. 2A.

Each of stages 351 of signal generating circuits 311 and 312 may include field effect transistors (not shown), such as complementary metal-oxide semiconductor (CMOS) transistors including p-channel metal-oxide semiconductor (PMOS) transistors and n-channel metal-oxide semiconductor (NMOS) transistors.

FIG. 3A shows an example where each of signal generating circuits 311 and 312 may include a ring oscillator having three stages 351 (e.g., three inverters). Each of signal generating circuits 311 and 312, however, may include a ring oscillator having more than three stages.

Count generator 320 of counter 202 may generate counts, such as counts $C_0$, $C_1$, and $C_2$. FIG. 3A shows only three counts for simplicity. Thus, count generator 320 may generate tens, hundreds, thousands, or more of counts (e.g., $C_0$ through $C_N$).

Count generator 320 may generate count $C_0$ having a counter value based at least in part on the numbers of transitions of signals $OUT0_0$ and $OUT1_0$. Count generator 320 may generate count $C_1$ having a counter value based at least in part on the numbers of transitions of signals $OUT0_1$ and $OUT1_1$. Count generator 320 may generate count $C_2$ based at least in part on the numbers of transitions of signals $OUT0_2$ and $OUT1_2$.

Controller 325 may provide a control to other components of counter 202 (e.g., signal generating circuits 311 and 312 and count generator 320) in the form of one or more signals. For example, controller 325 may provide signals $V_{READ}$ and $V_{DEC}$. Signal generating circuits 311 and 312 may receive signal $V_{READ}$ and $V_{DEC}$ during different operations of counter 302. For example, signal $V_{READ}$ may be received during a read operation. Signal $V_{DEC}$ may be received during a decrement operation. As described in more detail with reference to FIG. 3B, signal $V_{DEC}$ may be provided with a voltage greater than a voltage provided to signal $V_{READ}$.

Figure 3B:
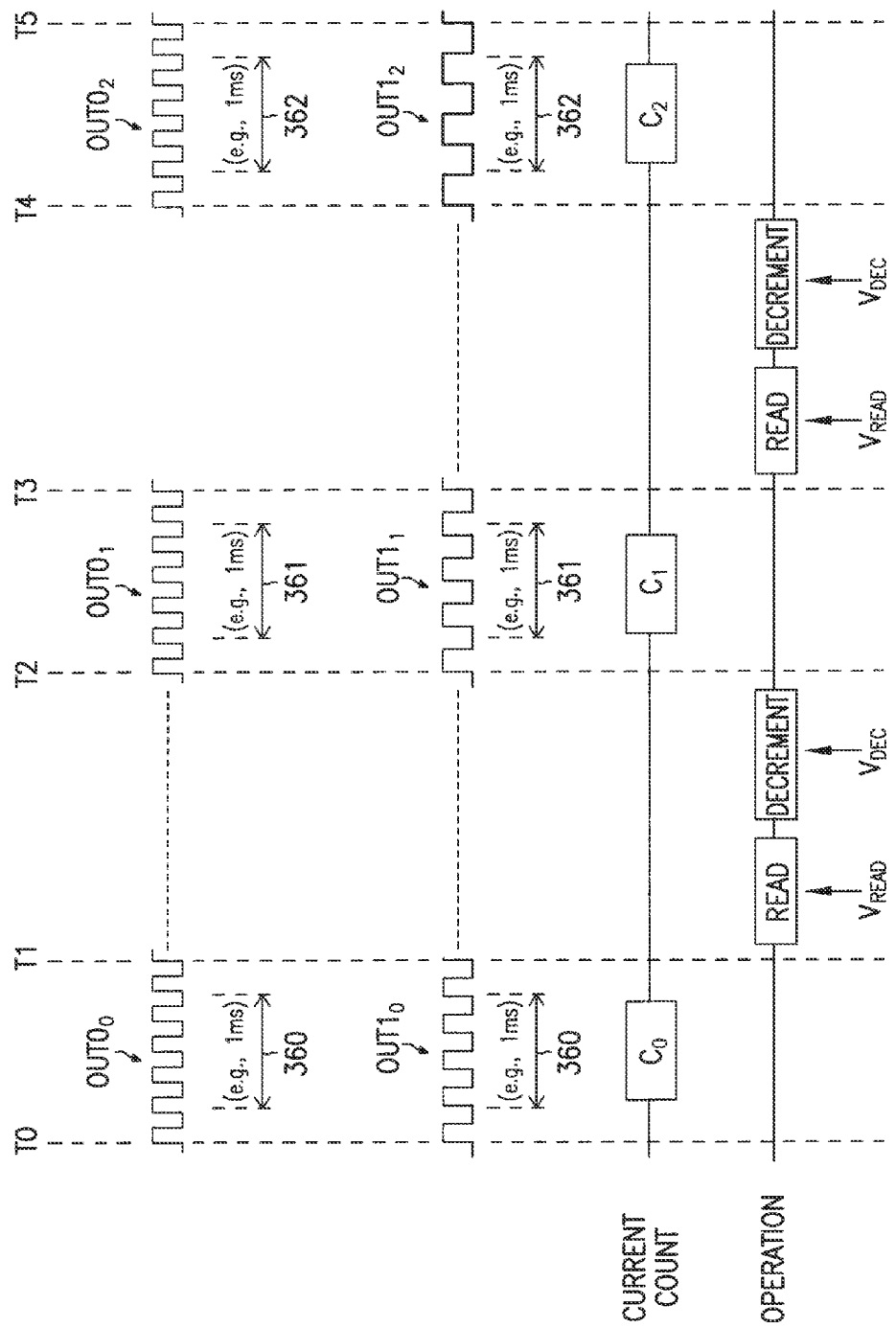
FIG. 3B shows a timing diagram for signals and example read and decrement operations of the counter of FIG. 3A, according to some embodiments of the invention.

FIG. 3B shows a timing diagram for signals $OUT0_0$, $OUT0_2$ $OUT1_0$, $OUT1_1$, and $OUT1_2$ and example read and decrement operations of counter 302 of FIG. 3A. In FIG. 3B, times T0 through T5 may be similar to or identical to those of FIG. 2B. As shown in FIG. 3B, count $C_0$ may be generated based on the numbers of transitions of signals $OUT0_0$ and $OUT1_0$ measured in an amount of time 360. Count $C_1$ may be generated based on the numbers of transitions of signals $OUT0_1$ and $OUT1_1$ measured in an amount of time 361. Count $C_2$ may be generated based on the numbers of transitions of signals $OUT0_2$ and $OUT1_2$ measured in an amount of time 362. Amount of times 360, 361, and 362 may have an equal value (e.g., 1 ms).

FIG. 3B shows examples of two different read operations: one read operation between times T1 and T2 and another read operation between times T3 and T4. A read operation may be performed to obtain (e,g., to read) a counter value of a current count of counter 302. FIG. 3B shows only one read operation between times T1 and T2 and between times T3 and T4 as an example. However, more than one read operation may be performed between times T1 and T2. More than one read operation may be performed between times T3 and T4. A read operation may be performed whenever a current counter value from counter is needed (e.g., needed by a processing unit such as processing unit 110 of FIG. 1, by an operating system such as operating system 131 of FIG. 1, or by an application such as application 132 of FIG. 1). Counter 302 may retain its current counter value after a read operation is performed.

In a read operation, counter 302 may measure numbers of transitions of respective the signals (e.g., $OUT0_1$) at output nodes 321 and 322 for an amount of time (e.g., 1 ms). Then, counter 302 may provide a counter value based on a difference in values between the measured numbers of transitions. Thus, depending on the values of measured numbers of transitions in a particular read operation, a different counter value may be obtained. For example, a read operation between times T1 and T2 may result in Obtaining a counter value associated with count $C_0$. The example read operation between times T3 and T4 in FIG. 3B may result in obtaining a counter value associated with count $C_1$. Counts $C_0$ and $C_1$ may have count values corresponding to count values $X_0$ and $X_1$, respectively, in FIG. 2C and FIG. 2D.

Signal $V_{READ}$ may be provided with a voltage that may not cause a time delay of stages 351 of signal generating circuits 311 and 312 to change. Thus, counter 302 may retain its current count value after a read operation. Counter 302 may provide the same counter value for a next read operation if a decrement operation is not performed on signal generating circuit 312 before the next read operation.

A decrement operation may be performed to change the counter value of counter 302. A decrement may be performed whenever a change (e.g., an increase) in counter value is needed. In a decrement operation, counter 302 may cause a time delay of stages 351 of the ring oscillator in signal generating circuit 312 to change (e.g., increase). The change in the time delay may change (e.g., decrease) the frequency of the signal at output node 322. Each of stages 351 may have a time delay (e.g., propagation delay from an input node to an output node in the inverter in each stage).

In a decrement operation, controller 325 may provide a control, such that signal $V_{DEC}$ may be provided with a voltage sufficient to stress (e.g., degrade) one or more transistors in stages 351. For example, signal $V_{DEC}$ may be provided with a voltage, such that it may induce a mechanism such as negative bias temperature instability (NBTI), positive bias temperature instability (PBTI), and hot carrier injection into the transistors of stages 351 of signal generating circuit 312. Such mechanism may cause the time delay of stages 351 of signal generating circuit 312 to increase. The increase in the time delay may decrease a response time of stages 351 in signal generating circuit 312. The decrease in the response time may decrease the frequency of the signals ($OUT1_0$, $OUT1_1$, and $OUT1_2$) at output node 322. For example, the decrement operation between times T1 and T2 may cause the frequency of signal OUT $1_1$ to be less than the frequency of signal $OUT1_0$, The decrement operation between times T3 and T4 and may cause the frequency of signal $OUT1_2$ to be less than the frequency of signal $OUT1_1$.

Therefore, after a decrement operation, the measured number of transitions of the signals at output node 322 for a given amount of time (e.g., 1 ms) may also decrease. For example, the number of transitions of signal $OUT1_1$ (after the decrement operation between times T1 and T2) may be less than the number of transitions of signal $OUT1_0$. The number of transitions of signal $OUT1_2$ (after the decrement operation between times T3 and. T4) may be less than the number of transitions of signal $OUT1_1$.

After each decrement operation the counter value may be checked (e.g., in a read operation) to deter whether the counter value has changed (e.g., from $X_0$ to $X_1$). If the counter value has not changed, one or more iterations of applying signal $V_{DEC}$ to stages 351 of signal generating circuit 312 performed until the counter value changes to a new counter value. If the counter value remains the same after the iterations, then it may be deemed that stages 351 of the ring oscillator in signal generating circuit 312 have reached their limit (e.g., stress limit). A decrement operation may no longer be performed to signal generating circuit 312.

As shown in FIG. 3A, signal $V_{DEC}$ may not be applied to signal generating circuit 311. This means that a decrement operation is not performed on signal generating circuit 311. Thus, the time delay of each of stages 351 of signal generating circuit 311 may remain unchanged. Therefore, controller 325 of counter 302 may maintain the signals $OUT0_0$, $OUT0_1$, and $OUT0_2$ at the same frequency between times T0 and T5.

Counter 302, having ring oscillators, as shown in FIG. 3A, may improve the size of a device or system (e.g., system 100) that includes counter 302. For example, some conventional counters may use fuses, such as one-time programmable (OTP) fuses, to store counter values. In such conventional counters, if N is the number of counter values to be generated, then the same N number of fuses may be needed. Thus, for a relatively large number of counter values (e.g., 16000 counts) a corresponding large number (e.g., 16000) of fuses may be needed in conventional counters. This may increase the size of conventional counters.

In counter 302, as described above, signal generating circuits 311 and 312 may include ring oscillators to generate signals that may be used to generate counter values. The transistors in ring oscillators may include transistors that have a relatively smaller size than that of the fuses in conventional counters. Thus, for a given number of counter values to be generated, counter 302 may have a relatively smaller size than that of a conventional counter.

FIG. 3A shows an example where a ring oscillator may be used to generate non-volatile monotonic counter values. However, any suitable circuit may be used to generate non-volatile monotonic counter values as described herein as long as the degradation in such a circuit could be measured. As an example, besides the measurements of changes in the numbers of transitions (e.g., changes in frequencies) at the signal at the output node of a ring oscillator as described herein, the amount of current in the circuit (e.g., a circuit besides a ring oscillator) before and after the degradation could be measured. Different amount of measured currents in the circuit may be used to generate different counter values, such as counter values $X_0$ through X5 and other counter values described above with reference to FIG. 2A through FIG. 3B, FIG. 4A shows a schematic diagram of a signal generating circuit 412, according to some embodiments described herein. Signal generating circuit 412 may be included in a counter, such as counters 102, 202, and 302 of FIG. 1, FIG. 2A, and FIG. 3A, respectively. For example, signal generating circuit 412 may correspond to signal generating circuit 212 (FIG. 2A) or 312 (FIG. 3A).

Figure 4A:
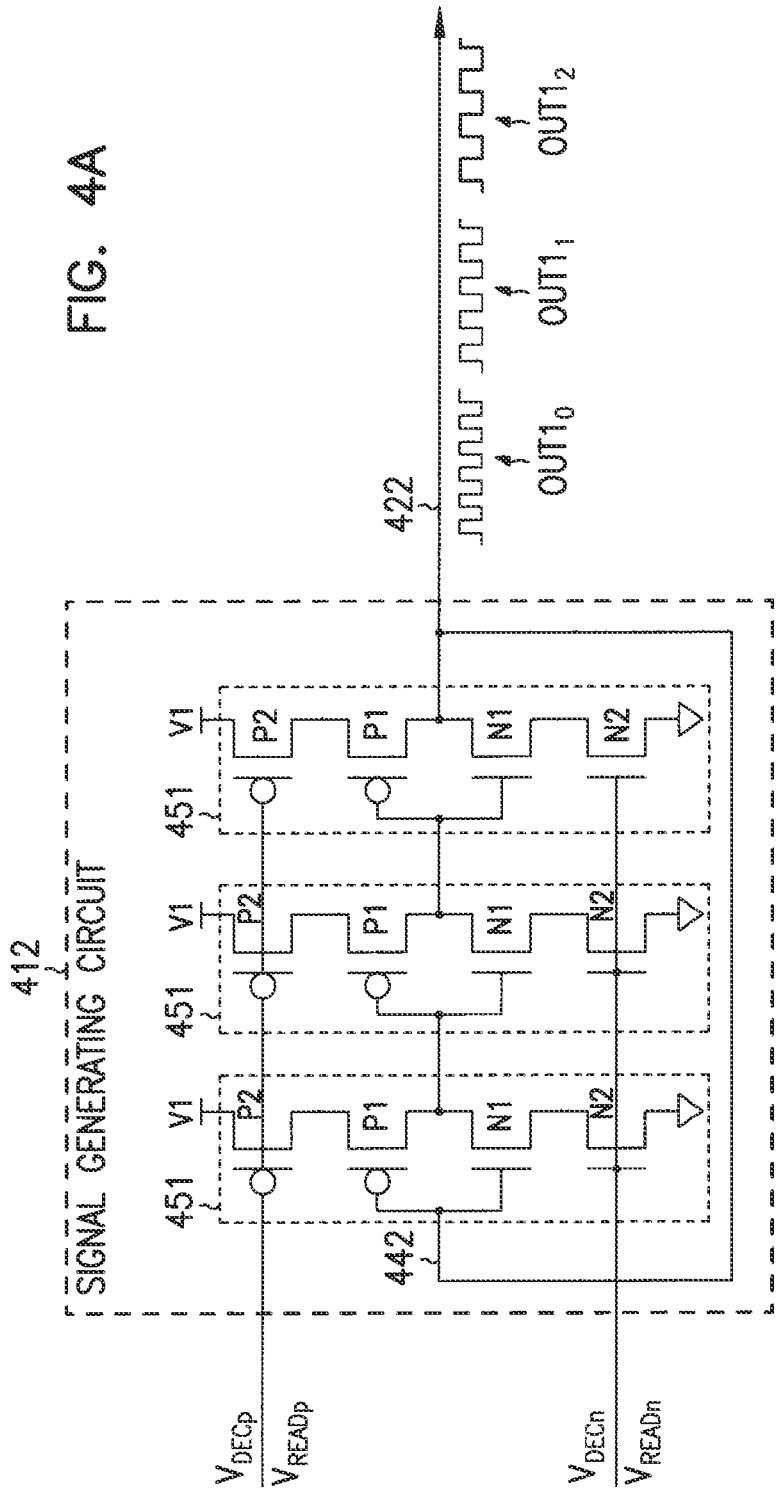
FIG. 4A shows a schematic diagram of a signal generating circuit that may be included in a counter, according to some embodiments described herein.

As shown in FIG. 4A, signal generating circuit 412 may include a ring oscillator having stages 451 coupled in series between an input node 442 and an output node 422. Stages 451 may correspond to stages 351 of signal generating circuit 312 of FIG. 3A. Signal generating circuit 412 may generate signals $OUT1_0$, $OUT1_1$, and $OUT1_2$, which may correspond to those of FIG. 2A and FIG. 3A. FIG. 4A shows an example where signal generating circuit 412 may include a ring oscillator having three stages 451. However, the number of stages may vary. Each of stages 451 may include transistors N1, N2, P1, and P2 coupled between a supply voltage V1 and ground. Transistors N1 and N2 may include NMOS transistors. Transistors P1 and P2 may include PMOS transistors.

Signal generating circuit 412 may receive signals $V_{READn}$ and $V_{READp}$ and signals $V_{DECn}$ and $V_{DECp}$. Signals $V_{READn}$ and $V_{READp}$ may collectively correspond to signal $V_{READ}$ of FIG. 3A. Thus, signals $V_{READn}$ and $V_{READp}$ may be received during a read operation of a counter (e.g., counter 302 of FIG. 3A) to obtain a counter value from the counter. Signals $V_{DECn}$ and $V_{DECp}$ may collectively correspond to signal $V_{DEC}$ of FIG. 3A. Thus, signals $V_{DECn}$ and $V_{DECp}$ may be received during a decrement operation of a counter (e.g., counter 302 of FIG. 3A) to change (e.g., increase) a time delay of stages 451 in order cause signals $OUT1_0$, $OUT1_1$, and $OUT1_2$ to have different frequencies.

FIG. 4A shows an example where signals $V_{DECn}$ and $V_{DECp}$ may be applied to transistors N2 and P2, respectively, in a decrement operation. In an alternative arrangement, however, only one of these two signals (e.g., either signal $V_{DECn}$ or $V_{DECp}$) may be applied to the respective transistors during a decrement operation. In the alterative arrangement, the transistors (N2 or P2) not being applied with signal $V_{DECn}$ or $V_{DECp}$ during the decrement operation may be applied with another signal. For example, either transistors P2 may be applied with a signal $V_{READp}$ in both read and decrement operation or transistors N2 may be applied with a signal $V_{READn}$ in both a read operation and a decrement operation.

Figure 4B:
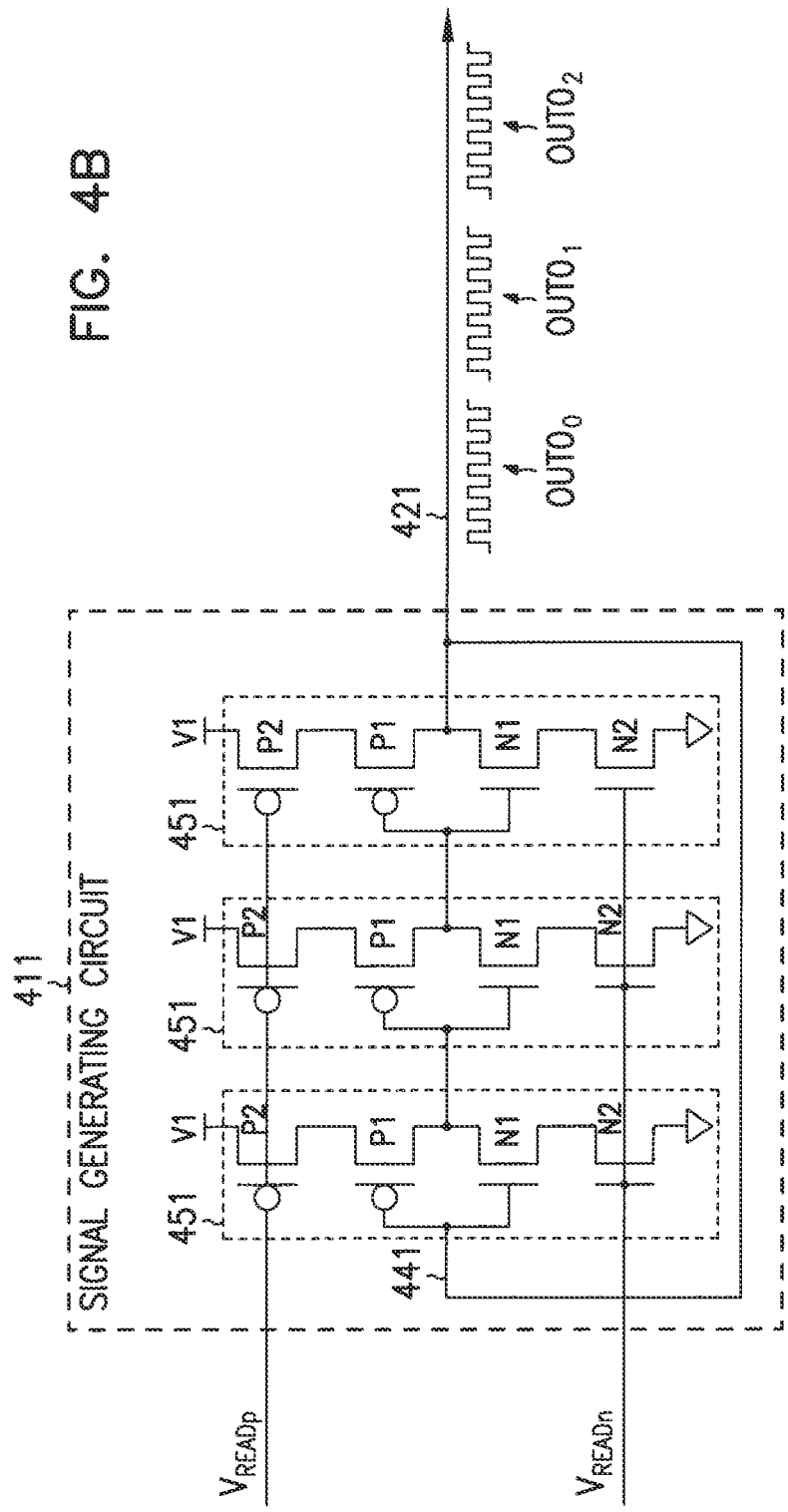
FIG. 4B shows a schematic diagram of another signal generating circuit that may be included in a counter, according to some embodiments described herein.

FIG. 4B shows a schematic diagram of a signal generating circuit 411, according to some embodiments described herein. Signal generating circuit 411 may include elements similar to or identical to those of signal generating circuit 412 of FIG. 4A. The description of such similar or identical elements are not repeated in the description of FIG. 4B. As shown in FIG. 4B, signal generating circuit 411 may include a ring oscillator having stages 451 coupled in series between an input node 441 and an output node 421 Signal generating circuit 411 may be included in a counter, such as counters 202 and 302 of FIG. 2A and FIG. 3A, respectively. Signal generating circuit 411 may correspond to signal generating circuit 212 (FIG. 2A) and 312 (FIG. 3A). Signal generating circuit 411 may receive signals $V_{READn}$ and $V_{READp}$ during a read operation of a counter (e.g., counter 302 of FIG. 3A). Signal generating circuit 411 may generate signals $OUT0_0$, $OUT0_1$, and $OUT0_2$, which may correspond to those of FIG. 2A and FIG. 3A.

FIG. 5 shows a block diagram of a counter 502 having multiple ring oscillators, according to some embodiments described herein. Counter 502 may include elements similar to or identical to those of counter 302 of FIG. 3A, such as signal generating circuits 311 and 312 including stages 351, count generator 320, and controller 325. Thus, description of similar or identical elements between FIG. 3A and FIG. 5 is not repeated in the description of FIG. 5.

As shown in FIG. 5, counter 502 may include additional signal generating circuit 513 having stages 351 coupled between an output node 523 and an input node 543. Similarly to a ring oscillator formed by stages 351 in each of signal generating circuits 311 and 312, stages 351 in signal generating circuit 513 may form a ring oscillator. Thus, counter 502 may include multiple (e.g., three) ring oscillators. FIG. 5 shows three signal generating circuits 311, 312, and 513 and three associated ring oscillators as an example. The number of signal generating circuits and associated ring oscillators may vary (e.g., more than three).

Multiple signal generating circuits 312 and 513 may increase the total number of count values that counter 502 may generate. For example, if each of signal generating circuits 312 and 513 is configured to allow counter 502 to generate a maximum of 50 different counter values, then both signal generating circuits 312 and 513 may allow counter 502 to generate a total number of 50×2=100 different counter values. Thus, the counter value (e.g., current counter value) may be the sum of a counter value generated based on the number of transitions of a signal from signal generating circuit 312 and another counter value generated based on the number of transitions of a signal from signal generating circuit 513, as described below.

As described above with reference to FIG. 3A and FIG. 3B, a decrement operation may not be preformed to signal generating circuit 311. Thus, as shown in FIG. 5, signals $OUT0_0$, $OUT0_1$, $OUT0_2$, $OUT0_i$, and $OUT0_j$) at output node 321 may have the same frequency.

One or more decrement operations may be preformed to signal generating circuit 312. After a certain number of decrement operations have been performed on signal generating circuit 312, it may reach a limit (e.g., stress limit). For example, a limit may be reached when the counter value generated based on the numbers of transitions of signals (e.g., $OUT0_i$ and $OUT1_i$ or $OUT0_j$ and. $OUT1_j$) at output nodes 321 and 322 (measured in a given amount of time (e.g., 1 ms)) may remain at the same counter value. For example, the counter value generated based on the numbers of transitions of signals $OUT0_i$ and $OUT1_i$ may remain at a value equivalent to decimal number value 50. The counter value generated based on the numbers of transitions of signals $OUT0_j$ and $OUT1_j$ may also be equivalent to decimal number value 50. Further decrement operations performed to signal generating circuit 312 may be stopped when signal generating circuit 312 reaches such a limit.

In order to increase the counter value (e.g., up to 100), two or more counter values may be combined to form a sum of counter values. For example, one or more decrement operations may be performed to signal generating circuit 513 after signal generating circuit 312 reaches its limit. Signal generating circuit 513 may generate signals having frequencies similar to or identical to those of the signals generated by signal generating circuit 312. For example, signals $OUT3_1$ and $OUT3_2$ may have frequencies similar to or identical to signals $OUT1_1$ and $OUT1_2$. FIG. 5 shows only two signals ($OUT3_1$ and $OUT3_2$) at output node 523 of signal generating circuit 513 as an example. Signal generating circuit 513 may generate more than two signals.

The sum of counter values may be formed from a counter value generated based on the number of transitions of signals (e.g., $OUT0_i$ and $OUT1_i$) from signal generating circuits 311 and 312 measured in a given amount of time (e.g., 1 ms). The other counter value in the sum may be generated based on the number of transitions of signals (e.g., $OUT0_i$ and $OUT3_1$) from signal generating circuits 311 and 513 measured in a given amount of time (e.g., 1 ms). For example, count $C_i$ of counter 502 may have a counter value equal to the sum of two counter values. One counter value e.g., equivalent to decimal 50) in the sum may be generated based on the number of transitions of signals $OUT0_i$ and $OUT1_i$. The other counter value (e.g., equivalent to decimal 1) in the sum may be generated based on the number of transitions of signals $OUT0_i$ and $OUT3_1$. Thus, in this example, the counter value (e.g., current counter value) of count $C_i$ of counter 502 may be equivalent to decimal number value 51 (50+1=51).

In another example, count of counter 502 may also have a counter value equal to the sum of two counter values. One counter value (e.g., equivalent to decimal 50) in the sum may be generated based on the numbers of transition of signals $OUT0_j$ and $OUT1_j$. The other counter value e.g., equivalent to decimal 2) in the sum may be generated based on the numbers of transition of signals $OUT0_j$ and $OUT3_2$. Thus, in this example, the counter value (e.g., current counter value) of count $C_j$ of counter 502 may be equivalent to decimal number value 52 (50+2=52).

Thus, as described above with reference to FIG. 5, counter 502 may generate counter values based on the numbers of transitions of signals from multiple (e.g., two or more) ring oscillators including multiple corresponding signal generating circuits. The counter value may be the sum of counter values generated from signals at the output nodes (e.g., 321, 322, and 523) of the multiple ring oscillators.

Figure 6:
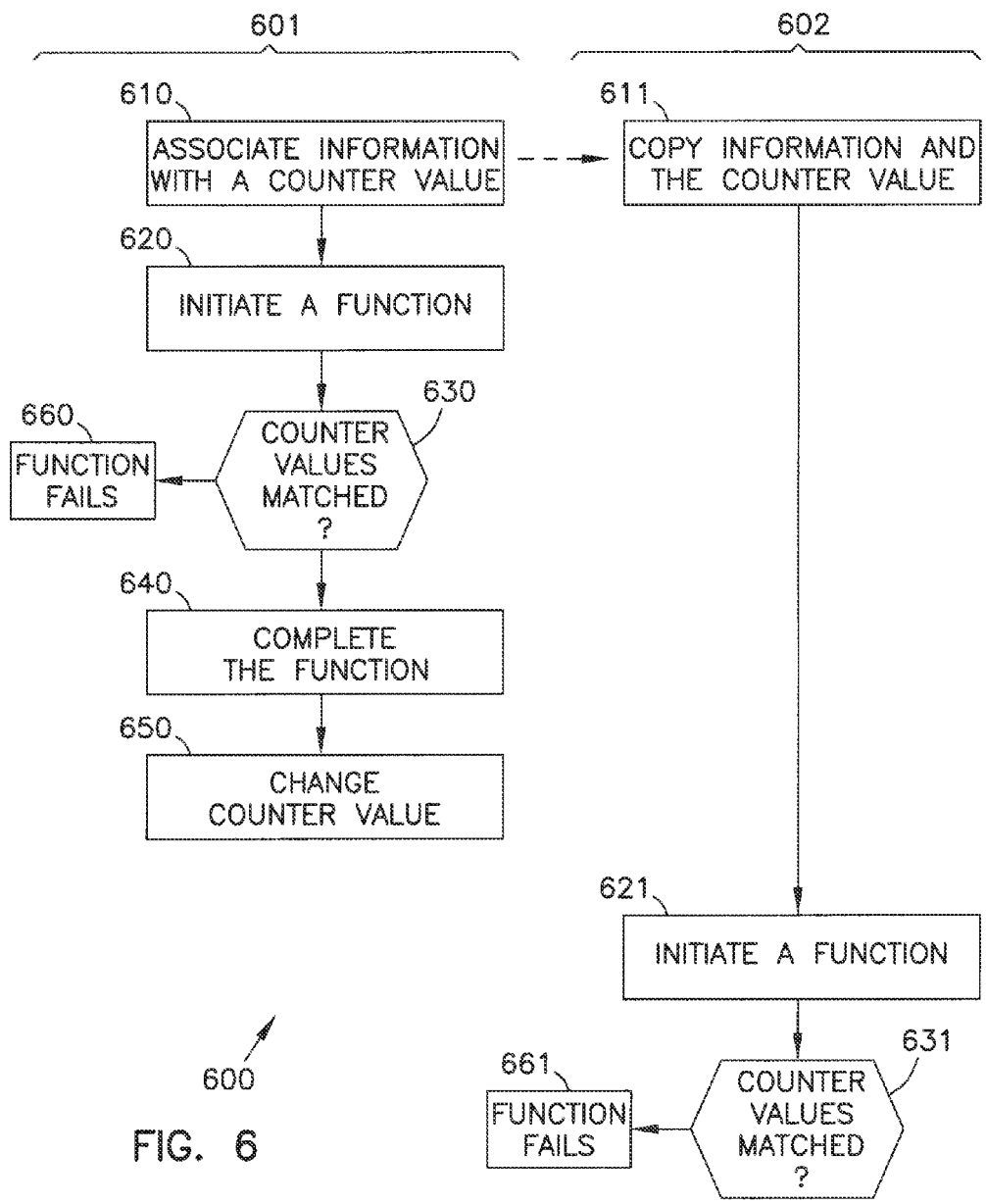
FIG. 6 is a flow diagram for a method of operating a system including a counter, according to some embodiments described herein.

FIG. 6 is a flow diagram for a method 600 of operating a system including a counter, according to some embodiments described herein. The system used in method 600 may include system 100 of FIG. 1. The counter used in method 600 may include counter 102, 202, or 302 described above with reference to FIG. 1 through FIG. 3. Method 600 may include activities to prevent or reduce the chance of a system, such as system 100, from attacks such as replay attacks and other malicious attacks. As shown in FIG. 6, method 600 may include portions 601 and 602. Portion 601 shows a valid operation in the system (e,g., operation involving trusted application software, such as application 132 in system 100). Portion 602 shows an operation (e.g., a replay attack) involving malware or other software in an attempt to copy another operation, such as an operation performed in portion 601.

As shown in portion 601, activity 610 may include associating information with a counter value. The information may include credit card numbers or other types of information. The counter value (e.g., $X_1$) may include a counter value from a counter described above with reference to FIG. 1 through FIG. 5. Thus, activity 610 may include obtaining a counter value (e.g., in a read operation) from the counter.

Activity 620 may include initiating a function. The function may include a transaction, such as a financial transaction involving the information. For example, the counter could be part of a handheld device (e.g., a smartphone or tablet) with an application to make a valid transaction over the Internet with a financial agent such as a bank or retailer. In making the transaction, the application might send to the financial agent information (e.g., credit card information) encrypted using count value X1. Activity 630 may then include the financial agent checking whether the counter value (X1 extracted from the encrypted information) associated with the information matches the counter value from the counter. Thus, checking the counter in activity 630 may include the financial agent separately obtaining the counter value (e.g., $X_1$) from the handheld device counter after extracting the count from the received information. The counter value from the counter may remain unchanged (e.g., remain at $X_1$) between activity 610 and activity 630. After the counter value is obtained, activity 630 may include comparing counter value (e.g., $X_1$) associated with the information with the counter value obtained in activity 630. Activity 630 may include determining whether the counter value (e.g., $X_1$) associated with the information matches the counter value from the counter.

Activity 640 may include completing the function initiated in activity 620 when the counter value (e.g., $X_1$) associated the information matches the counter value from the counter. For example, activity 640 may include completing a financial transaction involving the information, such as completing a purchase using a credit card number.

Activity 650 may include changing the counter value (e.g., current counter value $X_1$) to a new counter value (e.g., counter value $X_2$). Activity 650 may include performing a decrement operation to change the counter value. The decrement operation in activity 650 may include a decrement operation described above with reference to FIG. 1 through FIG. 5.

In activity 630, if the counter value (e.g., $X_1$) associated with the information does not match the counter value from the counter, the fraction fails. In this case, method 600 may continue with activity 660 to indicate that the function fails.

Thus, as described above, method 600 may compare a current counter value (e.g., using activity 630) with the counter value associated with the information (e.g., credit card number) each time the information is used in a function (e.g., the function in activity 620). If the counter values match, method 600 may complete the function. If the counter values do not match the function fails, in activity 650, method 600 may change the counter value after the function is completed in order to prevent a malicious attack (a replay attack by a malware), as described below.

In portion 602, a malware may attempt to perform a malicious attack, such as a replay attack, using the same information and associated with counter value used in portion 601. However, with the counter value used in method 600, the system may prevent such an attack.

For example, in activity 611, a malware may copy the information and associated counter value (e.g., $X_1$) used in activity 620. In activity 621, the malware may initiate a function. The function may be the same as the function in activity 620. As described above, method 600 may check (e.g., compare) whether the counter value associated with the information (to be performed in a function) matches the current counter value from the counter each time the information is used in a function. Thus, activity 631 of method 600 may include checking whether the counter value (e.g., $X_1$) associated with the (copied) information matches the counter value (e.g., current counter value) from the counter. Activity 631 may include obtaining the counter value from the counter. Since the counter value has been changed (e.g., from $X_1$ to $X_2$) in activity 650, the counter may provide counter value $X_2$ in activity 631. Activity 631 may include comparing the counter value (e.g., $X_1$) associated with the copied information with the counter value (e.g., $X_2$) obtained from the counter in activity 631. Since the counter has been changed, the counter value (e.g., $X_1$) associated with the copied information does not match the counter value (e.g., $X_2$) from the counter. Thus, activity 661 may indicate that the function fails. Method 600 may abort the operation. Therefore, an attack (e.g., replay attack) performed in portion 602 may be prevented.

In activity 631, the counter value (e.g., current counter value $X_2$) may be obtained by legitimate components (e.g., security components 101 in FIG. 1) in the system. However, even if a malware performing the malicious attack (as described above with reference to portion 602 of FIG. 6) can access the counter (e.g., access to output nodes of counter generator 220 of FIG. 2A or 320 of FIG. 3A), the malware would not be able to obtain the same counter value (e.g., counter value (e.g., $X_1$). The reason is that the counter value (e.g., $X_1$) has already been changed (e.g., increased) to another counter value (e.g., $X_2$) by activity 650 of method 600 after the function (e.g., a legitimate transaction) is completed in activity 640 and before the attack by the malware. Thus, by changing the counter value after the function is completed, as described above, method 600 may prevent a malicious (e.g., a replay attack) by a malware.

In the description above, a credit card number is used as an example for the information. Method 600 may be used with other kinds of information besides credit card numbers. As described above with reference to method 600, completing a function may be based on counter values of the counter. Thus, method 600 may further prevent or reduce the chance malicious attacks (e.g., replay attack) when the counter is included in a processing unit of the system, such as processing unit 110 of system 100 (FIG. 1).

Embodiments described herein may be implemented by firmware, hardware, or software, or by any combination of firmware, hardware, and software. Embodiments described herein may also be implemented as instructions stored on a computer-readable storage medium, which may be read and executed by at least one processor to perform the operations described herein. A computer-readable storage medium may include any non-transitory mechanism for storing information in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors of a system may be configured with the instructions to perform the operations described herein.

The illustrations of apparatus e.g., counter 102, 202, 302, and 502), system (e.g., system 100) and methods (e.g. method 600 and operating methods associated with the counters and systems described herein are intended to provide a general understanding of the structure of various embodiments and are not intended to provide a complete description of all the elements and features of apparatus that might make use of the structures described herein.

The entire counter or a portion of the counters (e.g., counter 102, 202, 302, and 502), the entire system or a portion of the system (e.g., system 100) described above may all be characterized as "modules" (or "module") herein. For example, such a module may include any combination of processing unit 110, security components 101, count generator 220 or 320, and/or controller 225 or 325, or any combination of these elements. Such modules may include hardware circuitry, single and/or multi-processor circuits, memory circuits, software program modules and objects and/or firmware, and combinations thereof, as desired by the architect of the apparatus (e.g., counter 102, 202, 302, and 502), system (e.g., system 100) and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Counter 102, 202, 302, and 502 described herein may be included in apparatus (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatus and system may further be included as sub-elements within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 2) players), vehicles, medical devices (e.g., heart monitor, blood pressure monitor, etc.), set top boxes, and others.

The embodiments described above with reference to FIG. 1 through FIG. 6 include a counter having a first generator to generate signals having different frequencies, and a second generator to generate counter values of the counter. Each of the counter values may be based at least in part on a number of transitions of a respective signal among the signals. Other embodiments including additional counters and systems and methods are described.

The above description and the drawings illustrate some embodiments to enable those skilled in the art to practice the embodiments of the inventions. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 27 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A counter comprising:
   a first generator to generate signals having different frequencies; and
   a second generator to generate counter values of the counter, wherein each of the counter values is based at least in part on a number of transitions of a respective signal among the signals, wherein the first generator is configured to generate the signals such that a first signal among the signals is generated before a second signal among the signals, and the second signal is generated before a third signal among the signals, and wherein a frequency of the first signal is greater than a frequency of the second signal, and the frequency of the second signal is greater than a frequency of the third signal.

2. The counter of claim 1, wherein the first generator includes at least one ring oscillator to generate at least one of the signals.

3. A counter comprising:
   a first generator to generate signals having different frequencies; and
   a second generator to generate counter values of the counter, wherein each of the counter values is based at least in part on a number of transitions of a respective signal among the signals, wherein the counter is configured to retain one of the counter values when supply power is disconnected from the counter.

4. The counter of claim 3, wherein the second generator is configured to generate the counter values, such that an order of the counter values is monotonic.

5. A counter comprising:
a first ring oscillator to generate a first signal;
a second ring oscillator to generate a second signal;
a generator to generate a counter value of the counter based at least in part on a number of transitions of the first signal and a number of transitions of the second signal; and
a third ring oscillator to generate a third signal, wherein the generator is configured to generate the counter value based at least in part on the number of transitions of the first signal, the number of transitions of the second signal, and a number of transitions of the third signal.

6. A counter comprising:
a first ring oscillator to generate a first signal;
a second ring oscillator to generate a second signal;
generator to generate a counter value of the counter based at least in part on a number of transitions of the first signal and a number of transitions of the second signal; and
a controller configured to cause a time delay of the second ring oscillator to change after the second signal is generated.

7. The counter of claim 6, wherein the controller is configured to maintain a time delay of the first ring oscillator after the first signal is generated.

8. The counter of claim 6, wherein the second ring oscillator is configured to generate a third signal after the time delay is changed, and the generator is configured to generate an additional counter value based at least in part on a number of transitions of the third signal.

9. The counter of claim 8, wherein the controller is configured to cause the time delay of the second ring oscillator to change after the third signal is generated.

10. A counter comprising:
a first ring oscillator to generate a first signal;
a second ring oscillator to generate a second signal; and
a generator to generate a counter value of the counter based at least in part on a number of transitions of the first signal and a number of transitions of the second signal, wherein the counter is configured to measure a plurality of transitions of the first signal for a first amount of time to obtain the number of transitions of the first signal and to measure a plurality of transitions of the second signal for a second amount of time to obtain the number of transitions of the second signal, and the first amount of time is equal to the second amount of time.

11. An electronic system comprising:
a counter including a first signal generating circuit to generate a first signal, and a second signal generating circuit to generate a second signal, and a generator to generate a counter value based at least in part on a difference in values between a number of transitions of the first signal and a number of transitions of the second signal; and
a module to obtain the counter value from the counter in an operation of the electronic system, wherein the first generating circuit includes a first ring oscillator to generate the first signal, and the second generating circuit includes a second ring oscillator to generate the second signal, and wherein the counter includes a third ring oscillator to generate a third signal, and the counter is configured to generate the counter value based on the difference in values between the number of transitions of the first signal and the number of transitions of the second signal and based on a difference in values between the number of transitions of the first signal and a number of transitions of the third signal.

12. An electronic system comprising:
a counter including a first signal generating circuit to generate a first signal, and a second signal generating circuit to generate a second signal, and a generator to generate a counter value based at least in part on a difference in values between a number of transitions of the first signal and a number of transitions of the second signal; and
a module to obtain the counter value from the counter in an operation of the electronic system, wherein the module is configured to store the difference in values between the number of transitions of the first signal and the number of transitions of the second signal, and wherein the module is configured to determine a number of times the counter has changed counter values based on the difference in values between the number of transitions of the first signal and the number of transitions of the second signal.

13. An electronic system comprising:
a counter including a first signal generating circuit to generate a first signal, and a second signal generating circuit to generate a second signal, and a generator to generate a counter value based at least in part on a difference in values between a number of transitions of the first signal and a number of transitions of the second signal: and
a module to obtain the counter value from the counter in an operation of the electronic system, wherein the module is configured to cause the counter to change the counter value after every fixed period of time has elapsed.

14. An electronic system comprising:
a counter including a first signal generating circuit to generate a first signal, and a second signal generating circuit to generate a second signal, and a generator to generate a counter value based at least in part on a difference in values between a number of transitions of the first signal and a number of transitions of the second signal;
a module to obtain the counter value from the counter in an operation of the electronic system; and
a semiconductor die, wherein the module includes a processing unit, and the processing unit and the counter are located in the semiconductor die.

15. An electronic system comprising:
a counter including a first signal generating circuit to generate a first signal, and a second signal generating circuit to generate a second signal, and a generator to generate a counter value based at least in part on a difference in values between a number of transitions of the first signal and a number of transitions of the second signal;
a module to obtain the counter value from the counter in an operation of the electronic system; and
a display coupled to the module.

16. An electronic device comprising:
a counter to generate a count in a uni-direction for a security application and to generate a new count value in the uni-direction in response to a control and retain the new count value after the electronic device has been powered off, wherein the control causes at least one transistor in the counter to degrade.

17. The electronic device of claim 16, wherein the control causes a voltage sufficient to degrade the at least one transistor to be applied to the at least one transistor.

18. The electronic device of claim 17, wherein the at least one transistor is part of a ring oscillator.

19. A method of operating a counter, the method comprising:
- obtaining a counter value from the counter, wherein the counter value is generated based at least in part on a signal from at least one ring oscillator included in the counter;
- associating information with the counter value;
- performing a function on the information associated with the counter value;
- changing the counter value of the counter when the function is completed; and
- comparing the counter value from the counter before changing the counter value with the counter value associated with the information, wherein the function is completed when the counter value associated with the information matches the counter value from the counter.

20. A method of operating a counter, the method comprising:
- obtaining a counter value from the counter, wherein the counter value is generated based at least in part on a signal from at least one ring oscillator included in the counter;
- associating information with the counter value;
- performing a function on the information associated with the counter value; and changing the counter value of the counter when the function is completed, wherein changing the counter value includes increasing a time delay of the counter.

* * * * *